United States Patent
Lee et al.

(10) Patent No.: US 9,261,557 B1
(45) Date of Patent: Feb. 16, 2016

(54) SEMICONDUCTOR APPARATUS AND TEST DEVICE THEREFOR

(71) Applicant: SK hynix Inc., Icheon-si Gyeonggi-do (KR)

(72) Inventors: Chang Hyun Lee, Icheon-si (KR); Young Jun Ku, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/532,725

(22) Filed: Nov. 4, 2014

(30) Foreign Application Priority Data

Sep. 5, 2014 (KR) .................. 10-2014-0118829

(51) Int. Cl.
*G11C 29/00* (2006.01)
*G01R 31/317* (2006.01)
*G11C 7/10* (2006.01)
*G11C 7/22* (2006.01)
*G11C 29/02* (2006.01)

(52) U.S. Cl.
CPC ........ *G01R 31/31727* (2013.01); *G11C 7/1084* (2013.01); *G11C 7/22* (2013.01); *G11C 29/022* (2013.01)

(58) Field of Classification Search
USPC .............................. 365/201, 189.07, 189.011
See application file for complete search history.

(56) References Cited

U.S. PATENT DOCUMENTS

2003/0085731 A1* 5/2003 Iwase ............... G01R 31/31701 326/16
2003/0106000 A1* 6/2003 Song ..................... G11C 29/40 714/718

FOREIGN PATENT DOCUMENTS

KR 1020020053490 A 7/2002
KR 1020080093901 A 10/2008

* cited by examiner

*Primary Examiner* — Vu Le
(74) *Attorney, Agent, or Firm* — William Park & Associates Ltd.

(57) ABSTRACT

A semiconductor apparatus includes a clock enable signal buffer unit configured to receive an input clock enable signal, and generate an output clock enable signal; a buffer control unit configured to generate a buffer enable signal in response to the output clock enable signal and a test enable signal; an input/output buffer unit configured to receive input patterns and generate output patterns; and a compression test unit configured to test the output patterns and the output clock enable signal according to the test enable signal.

20 Claims, 4 Drawing Sheets

SEMICONDUCTOR APPARATUS AND TEST DEVICE THEREFOR

CROSS-REFERENCES TO RELATED APPLICATION

The present application claims priority under 35 U.S.C. §119(a) to Korean application number 10-2014-0118829, filed on Sep. 5, 2014, in the Korean Intellectual Property Office, which is incorporated herein by reference in its entirety.

BACKGROUND

1. Technical Field

Various embodiments generally relate to a semiconductor integrated apparatus, and more particularly, to a semiconductor apparatus and a test device therefor.

2. Related Art

The degree of integration of a semiconductor apparatus is improved as time goes on. Further, a multi-chip structure in which a plurality of chips are packaged into one package, a system-on-chip structure in which a system is configured by one chip, and so forth have been developed.

After a semiconductor apparatus is manufactured, a procedure for testing the performance of the semiconductor apparatus is performed to check whether a fail has occurred in a manufacturing process.

In particular, an input/output buffer, a clock enable buffer, and so forth, which are disposed in a semiconductor apparatus, should be necessarily tested to check the integrity of signals to be transmitted and received between a semiconductor memory apparatus and an external device.

As a semiconductor apparatus is highly integrated, a precise and high speed test method has been demanded.

SUMMARY

In an embodiment, a semiconductor apparatus may include a clock enable signal buffer unit configured to receive an input clock enable signal, and generate an output clock enable signal. The semiconductor apparatus may include a buffer control unit configured to generate a buffer enable signal in response to the output clock enable signal and a test enable signal. The semiconductor apparatus may include an input/output buffer unit configured to receive input patterns and generate output patterns. Further, the semiconductor apparatus may include a compression test unit configured to test the output patterns and the output clock enable signal according to the test enable signal.

In an embodiment, a test device may include a buffer control unit configured to generate a buffer enable signal in response to an output clock enable signal provided from a clock enable signal buffer unit and a test enable signal. The test device may also include a compression test unit configured to test output patterns provided from an input/output buffer unit and the output clock enable signal in response to the test enable signal.

In an embodiment, a semiconductor apparatus may include a clock enable signal buffer unit configured to buffer an input enable signal provided from a memory device and to generate an output clock enable signal. The semiconductor apparatus may also include a logic circuit configured to output a buffer enable signal in response to the output clock enable signal and a test enable signal. Further, the semiconductor apparatus may include an input/output buffer unit configured to generate output patterns in response to the buffer enable signal. The semiconductor apparatus may also include a compression test unit driven in response to the test enable signal to perform a test by receiving the output patterns and the output clock enable signal and to output a test result signal.

DETAILED DESCRIPTION

Hereinafter, a semiconductor apparatus and a test device therefor will be described with reference to the accompanying drawings through various embodiments.

Figure 1:
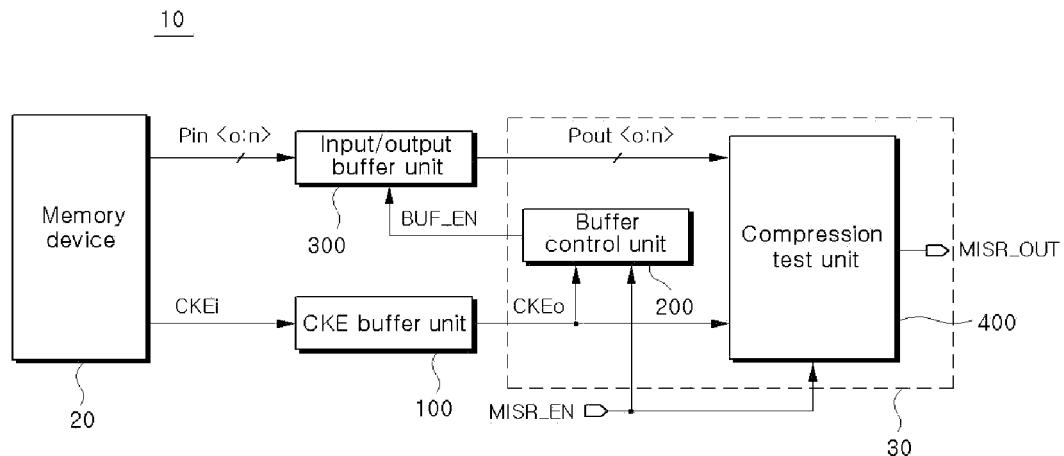
FIG. 1 is a configuration diagram illustrating a representation of an example of a semiconductor apparatus in accordance with an embodiment.

Referring to FIG. 1, a configuration diagram illustrating a representation of an example of a semiconductor apparatus in accordance with an embodiment is shown.

A semiconductor apparatus 10 may include a memory device 20, a clock enable signal (CKE) buffer unit 100, a buffer control unit 200, an input/output buffer unit 300, and a compression test unit 400. In an embodiment, the buffer control unit 200 and the compression test unit 400 may configure a test device 30.

The clock enable signal buffer unit 100 buffers an input clock enable signal CKEi provided from the memory device 20. The clock enable signal buffer unit 100 also generates an output clock enable signal CKEo.

The buffer control unit 200 generates a buffer enable signal BUF_EN in response to the output clock enable signal CKEo and a test enable signal MISR_EN. In particular, the buffer control unit 200 may be configured to output the buffer enable signal BUF_EN which has a preset level regardless of the level of the output clock enable signal CKEo when the test enable signal MISR_EN is enabled.

Figure 2A:
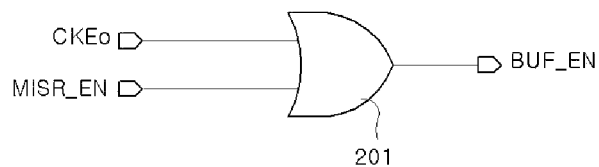
FIGS. 2A and 2B are diagrams illustrating representations of examples of a buffer control unit in accordance with an embodiment.
Figure 2B:
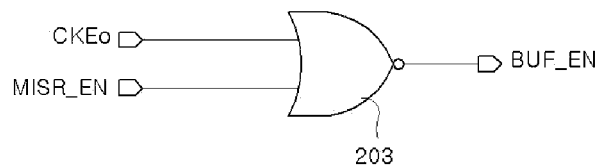

Referring to FIGS. 2a and 2b, diagrams illustrating representations of examples of the buffer control unit 200 are shown.

A buffer control unit 200-1 shown in FIG. 2a may include a first logic circuit 201 which outputs the buffer enable signal BUF_EN in response to the output clock enable signal CKEo and the test enable signal MISR_EN. The first logic circuit 201 may be an OR gate.

A buffer control unit 200-2 shown in FIG. 2b may include a second logic circuit 203. The second logic circuit 203 may include, for example, a NOR gate.

The input/output buffer unit 300 buffers input patterns Pin<0:n> provided from the memory device 20. The input/output buffer unit 300 also generates output patterns Pout<0:n>. More specifically, the input/output buffer unit 300 generates the output patterns Pout<0:n> in response to the buffer enable signal BUF_EN generated by the buffer control unit 200. Accordingly, the input/output buffer unit 300 retains an on state without relying on the level of the output clock enable signal CKEo in a test mode. Further, the input/output buffer unit 300 may generate the output patterns Pout<0:n> according to the buffer enable signal BUF_EN which always has a fixed output level in the test mode.

Figure 3:
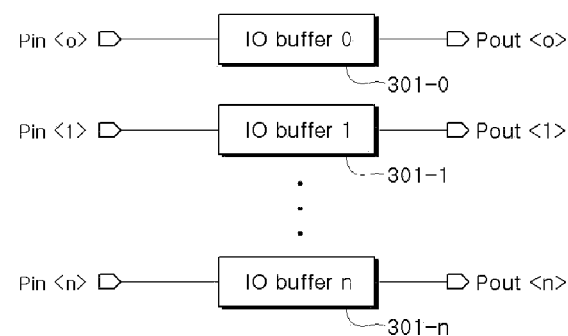
FIG. 3 is a configuration diagram illustrating a representation of an example of an input/output buffer unit in accordance with an embodiment.

Referring to FIG. 3, an example of the input/output buffer unit 300 is shown.

An input/output buffer unit 300-1 shown in FIG. 3 may include a plurality of IO buffers 301-0 to 301-$n$ provided with and buffer the input patterns Pin<0:n> and generate the output patterns Pout<0:n>. The output patterns Pout<0:n> which are outputted simultaneously from the plurality of IO buffers 301-0 to 301-$n$ may be provided to the compression test unit 400.

The compression test unit 400 is driven in response to the test enable signal MISR_EN. The compression test unit 400 performs a test by receiving the output patterns Pout<0:n> from the input/output buffer unit 300 and the output clock enable signal CKEo from the clock enable signal buffer unit 100. The compression test unit 400 also outputs a test result signal MISR_OUT.

The compression test unit 400 may use, for example, a multiple input signature register (MISR). The MISR is a test device which compresses test patterns in parallel and tests integrity. In the MISR, a characteristic that a compression result is outputted differently from a predicted value (a reference signal) when even one of inputted test patterns has an erroneous value is used.

Figure 4:
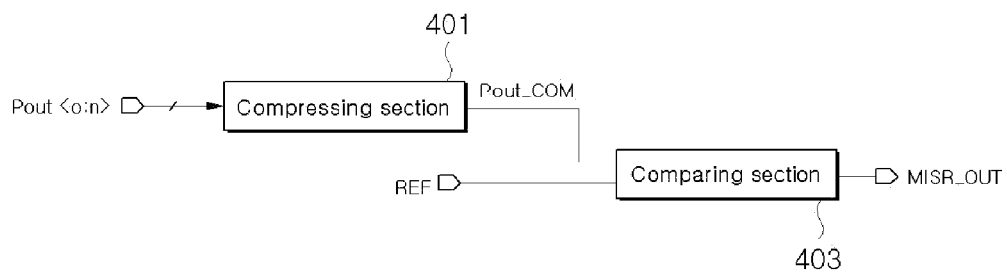
FIG. 4 is a configuration diagram illustrating a representation of an example of a compression test unit in accordance with an embodiment.

Referring to FIG. 4, an example of the compression test unit 400 is shown.

In FIG. 4, a compression test unit 400-1 may include a compressing section 401 and a comparing section 403.

The compressing section 401 receives the output patterns Pout<0:n> and outputs a compressed signal Pout_COM.

The comparing section 403 compares the compressed signal Pout_COM with a reference signal REF which is stored in advance. The comparing section 403 also outputs a comparison result as the test result signal MISR_OUT. The reference signal REF may be preset through a simulation for the input/output buffer unit 300 and the clock enable signal buffer unit 100. The reference signal REF may also be stored in advance in a specified register.

According to the test result signal MISR_OUT outputted from the comparing section 403, it is possible to check whether the input/output buffer unit 300 and the clock enable signal buffer unit 100 are normal or abnormal.

Figure 5:
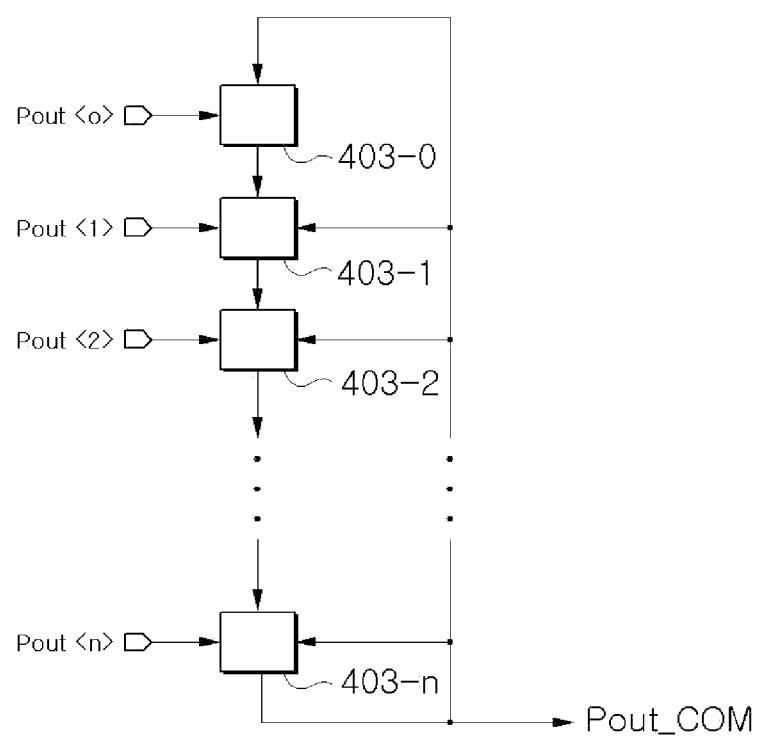
FIG. 5 is a configuration diagram illustrating a representation of an example of a compressing section in accordance with an embodiment.

Referring to FIG. 5, an example of a compressing section 401-1 is shown.

The compressing section 401-1 may include a plurality of unit cells 403-0 to 403-$n$. The number of the unit cells 403-0 to 403-$n$ may correspond to the number of the bits of the output patterns Pout<0:n>.

The respective unit cells 403-0 to 403-$n$ may include, but not limited to, adders which receive, as input signals, the respective bits of the output patterns Pout<0:n>, the output signals of previous stage unit cells and the output signal of a final stage unit cell, and registers which delay the output signals of the adders by a predetermined time.

In an embodiment, it is to be noted that the clock enable signal buffer unit 100 is tested together with the plurality of IO buffers which configure the input/output buffer unit 300.

IO buffers are generally turned on and off by a clock enable signal. In this regard, if the clock enable signal is disabled in a test mode, since the IO buffers are turned off, a test may not be normally performed. Moreover, a clock enable signal buffer unit should be tested in its performance.

Therefore, by retaining the IO buffers 301-0 to 301-$n$ in on states regardless of the output signals of the clock enable signal buffer unit 100, it is possible to test both the IO buffers 301-0 to 301-$n$ and the clock enable signal buffer unit 100.

The output patterns Pout<0:n> provided from the input/output buffer unit 300 and the output clock enable signal CKEo provided from the clock enable signal buffer unit 100 may be tested at a high speed in parallel by the compression test unit 400.

Figure 6:
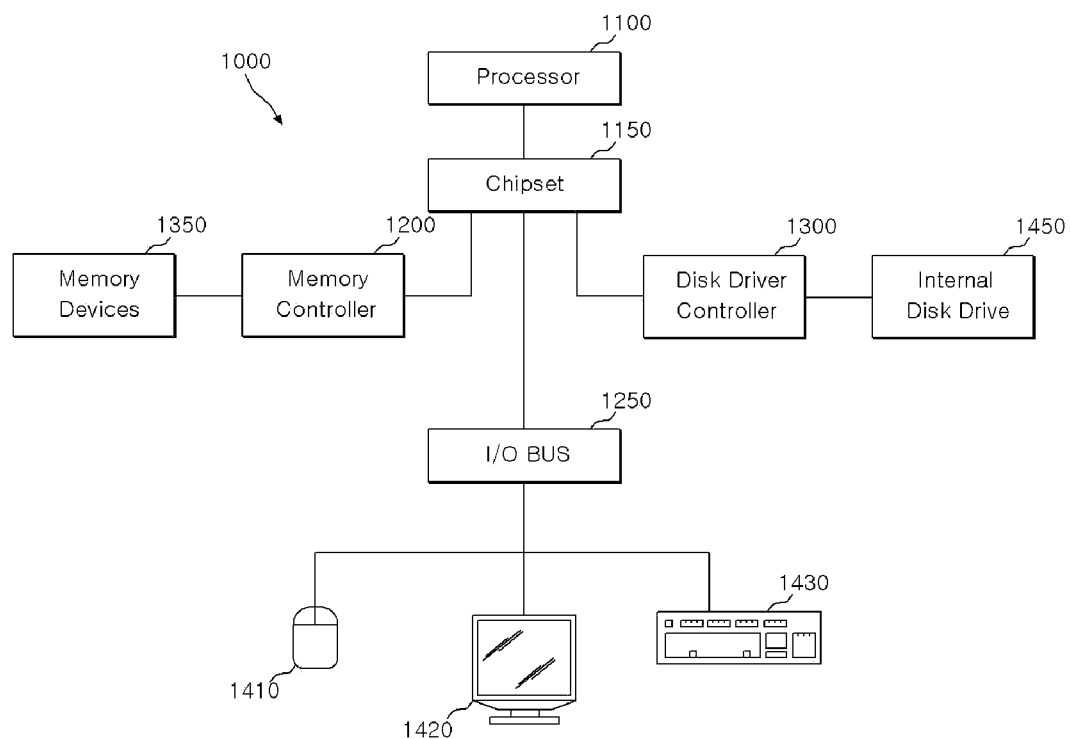
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may operably electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory devices 1350 may include the semiconductor apparatus 10 described above.

The chipset 1150 may also be electrically coupled to the I/O bus 1250. The I/O bus 1250 may serve as a communication pathway for signals form the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol, including all of those mentioned above with regard to the I/O bus 1250.

While various embodiments have been described above, it will be understood to those skilled in the art that the embodiments described are by way of example only. Accordingly, the semiconductor apparatus and the test device described should not be limited based on the described embodiments.

What is claimed is:
1. A semiconductor apparatus comprising:
a clock enable signal buffer unit configured to receive an input clock enable signal, and generate an output clock enable signal;
a buffer control unit configured to generate a buffer enable signal in response to the output clock enable signal and a test enable signal;
an input/output buffer unit configured to receive input patterns and generate output patterns; and
a compression test unit configured to test the output patterns and the output clock enable signal according to the test enable signal.

2. The semiconductor apparatus according to claim 1, wherein the buffer control unit generates the buffer enable signal which is independent of a level of the output clock enable signal.

3. The semiconductor apparatus according to claim 1, wherein the compression test unit includes a multiple input signature register.

4. The semiconductor apparatus according to claim 1, wherein the compression test unit comprises:
 a compressing section configured to compress the output patterns in parallel and generate a compressed signal; and
 a comparing section configured to compare the compressed signal and a reference signal, and generate a test result signal.

5. The semiconductor apparatus according to claim 1, wherein the input/output buffer unit includes a plurality of input/output buffers, and the compression test unit receives in parallel the output patterns respectively outputted from the plurality of input/output buffers.

6. A test device comprising:
 a buffer control unit configured to generate a buffer enable signal in response to an output clock enable signal provided from a clock enable signal buffer unit and a test enable signal; and
 a compression test unit configured to test output patterns provided from an input/output buffer unit and the output clock enable signal in response to the test enable signal.

7. The test device according to claim 6, wherein the buffer control unit generates the buffer enable signal, wherein the buffer enable signal is independent of a level of the output clock enable signal.

8. The test device according to claim 6, wherein the compression test unit includes a multiple input signature register.

9. The test device according to claim 6, wherein the compression test unit comprises:
 a compressing section configured to compress the output patterns in parallel and generate a compressed signal; and
 a comparing section configured to compare the compressed signal and a reference signal, and generate a test result signal.

10. The test device according to claim 6, wherein the input/output buffer unit includes a plurality of input/output buffers, and the compression test unit receives in parallel the output patterns respectively outputted from the plurality of input/output buffers.

11. A semiconductor apparatus comprising:
 a clock enable signal buffer unit configured to buffer an input enable signal provided from a memory device and to generate an output clock enable signal;
 a logic circuit configured to output a buffer enable signal in response to the output clock enable signal and a test enable signal;
 an input/output buffer unit configured to generate output patterns in response to the buffer enable signal; and
 a compression test unit driven in response to the test enable signal to perform a test by receiving the output patterns and the output clock enable signal and to output a test result signal.

12. The semiconductor apparatus according to claim 11, wherein the compression test unit includes a multiple input signature register (MISR) configured to compress test patterns.

13. The semiconductor apparatus according to claim 12, where the compression test unit comprises:
 a compression section configured to receive the output patterns and to output a compressed signal; and
 a comparing section configured to compare the compressed signal with a reference signal and output a comparison result as the test result signal.

14. The semiconductor apparatus according to claim 13, wherein the test result signal allows for a determination to made as to whether abnormalities are found with the input/output buffer unit and the clock enable signal buffer.

15. The semiconductor apparatus according to claim 11, wherein the clock enable signal buffer unit is tested with a plurality of IO buffers that are included in the input/output buffer unit.

16. The semiconductor apparatus according to claim 11, wherein the compression test unit is configured to test in parallel the output patterns and the output clock enable signal.

17. The semiconductor apparatus according to claim 15, wherein the plurality of IO buffers and the clock enable signal buffer unit can be tested when the plurality of IO buffers are in an on-state.

18. The semiconductor apparatus according to claim 17, wherein the plurality of IO buffers are turned off and on in response to a clock enable signal.

19. The semiconductor apparatus according to claim 15, wherein the output patterns are outputted simultaneously from the plurality of IO buffers and are provided to the compression test unit.

20. The semiconductor apparatus according to claim 11, wherein the input/output buffer unit is in an on-state in a test mode.

* * * * *